(12) United States Patent
Gongwer

(10) Patent No.: US 6,751,129 B1
(45) Date of Patent: Jun. 15, 2004

(54) EFFICIENT READ, WRITE METHODS FOR MULTI-STATE MEMORY

(75) Inventor: Geoffrey S. Gongwer, Los Altos, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 10/152,536

(22) Filed: May 21, 2002

(51) Int. Cl.$^7$ .................................................. G11C 7/00
(52) U.S. Cl. ................ 365/189.05; 365/51; 365/185.05
(58) Field of Search ............................. 365/185.33, 51, 365/185.03, 185.05, 189.05, 185.01

(56) References Cited

U.S. PATENT DOCUMENTS

| | | | |
|---|---|---|---|
| 5,592,435 A | 1/1997 | Mills et al. ............... | 365/233.5 |
| 5,655,105 A | 8/1997 | McLaury .................... | 395/496 |
| 5,890,192 A * | 3/1999 | Lee et al. .................... | 711/103 |
| 5,946,233 A * | 8/1999 | Kim et al. ............. | 365/185.12 |
| 6,105,106 A | 8/2000 | Manning .................... | 711/105 |
| 6,115,774 A * | 9/2000 | Ezawa et al. ............... | 710/316 |
| 6,154,417 A | 11/2000 | Kim ............................ | 365/233 |
| 6,178,115 B1 | 1/2001 | Shibata et al. ......... | 365/185.03 |
| 6,222,762 B1 | 4/2001 | Guterman et al. ...... | 365/185.03 |
| 6,222,767 B1 * | 4/2001 | Kendall et al. ......... | 365/185.12 |
| 6,282,556 B1 | 8/2001 | Chehrazi et al. ............ | 708/521 |
| 6,282,603 B1 | 8/2001 | Rao .............................. | 711/5 |
| 2002/0048196 A1 | 4/2002 | Kwon et al. ........... | 365/189.12 |

FOREIGN PATENT DOCUMENTS

EP  0 704 848 A2  4/1996 ............ G11C/7/00

* cited by examiner

*Primary Examiner*—Gene Auduong
(74) *Attorney, Agent, or Firm*—Ritter, Lang & Kaplan LLP

(57) ABSTRACT

Methods and apparatus for efficiently writing data to and reading data from multi-state memory cells. According to one aspect of the present invention, a memory system includes a first storage element, a data source, a first element, a second element, and a ripple clock. The data source provides a plurality of bits to be stored in the first storage element, and the first element receives a first bit from the data source, and also clocks the first bit into the second element. The first element then receives a second bit of the plurality of bits from the data source substantially while the first bit is being stored into the first storage element. The ripple clock enables access to the first element and the second element such that the first bit and the second bit may be pipelined.

38 Claims, 11 Drawing Sheets

EFFICIENT READ, WRITE METHODS FOR MULTI-STATE MEMORY

BACKGROUND OF THE INVENTION

1. Field of Invention

The present invention relates generally to mass digital data storage systems. More particularly, the present invention relates to systems and methods for reducing the overhead associated with multi-state storage systems.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices that are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Data that are streamed into a memory system are generally written into memory cells or, more generally, storage elements on a bit-by-bit basis and read out of the storage elements on a bit-by-bit basis. As will be understood by those skilled in the art, write operations are generally slow, e.g., take a relatively long time to perform. Often, some read operations may be time-consuming as well.

As will be appreciated by those skilled in the art, bits that are to be written into or read out of cells are typically buffered. Bits are generally buffered when a data bus has a width to and from memory that is substantially less than the number of bits which may be written to, read from, or operated on in parallel in the memory. Buffering bits also alleviates bandwidth and power consumption issues.

A master-slave register bit is generally needed for each bit that is to be buffered. Typically, each master-slave register bit requires up to approximately twenty-four transistors for implementation. One conventional master-slave register, or master-slave flip flop, is shown in FIG. 12. A master-slave register 1200 which includes a reset function is suitable for use in buffering a bit. For a non-volatile memory system, as for example a memory system that includes up to approximately 4000 cells or storage elements that may be operated on simultaneously, one or two bits may generally be stored in each cell. As such, when each of the 16,000 bits are to be buffered, 16,000 master-slave register bits may be required, which, in turn, generally requires a relatively high number of total transistors. Implementing a relatively high number of transistors which support master-slave register bits may occupy more physical space within a memory system than desired and therefore be more expensive.

In order to reduce the number of transistors needed to buffer bits in a memory device, single data latches may be implemented for use as buffers in lieu of master-slave latches or master-slave register bits. Each memory cell may operated simultaneously have one or more associated latches which are suitable for buffering both data that are to be stored in the memory cell and data that are to be read from the memory cell. The use of single data latches rather than master-slave latches may allow the number of transistors associated with buffering capabilities to be reduced by up to approximately fifty percent. However, while master-slave latches use a relatively simple clocking scheme to select individual master-slave latches to be accessed, the use of data latches generally require more complicated addressing schemes to access individual data latches. Such addressing schemes may, in some cases, require more transistors than are required to support master-slave latches or master-slave bits.

Since an addressing scheme which may utilize a relatively high number of transistors may not be efficient, ripple clocks are sometimes implemented to enable data latches to be accessed sequentially. That is, the single data latch associated with each memory cell may be accessed sequentially with respect to the data latches associated with other memory cells in a memory device. One example of data latches which are accessed by a ripple clock is shown in FIG. 13a. A system 1300 includes latches 1310 and master-slave registers or master-slave flip-flops 1314. Latches 1310 are data latches which are each associated with a memory cell, and are enabled by latch enable (LE) signals. Specifically, latch 1310a is enabled by an LEA signal, latch 1310b is enabled by a LEB signal which is an output of flip-flop 1314, and latch 1310c is enabled by a LEC signal which is an output of flip-flip 1314b. Flip-flops 1314 are generally controlled by a common clock (CK) signal.

In general, only one LE signal is asserted at any given time, and the asserted LE signal is effectively propagated by flip-flops 1314. The set of asserted LE signals effectively forms a ripple clock. As shown in a timing diagram 1350 of FIG. 13b, an LEA signal 1360a, an LEB signal 1360b, and an LEC signal 1360c are such that only one LE signal 1360 is asserted, e.g., at a high value, at any point in time to trigger latches 1310 of FIG. 13a.

A ripple clock that is implemented in a system such as system 1300 of FIG. 13a requires a master-slave latch or a flip-flop which generates the enable signal or signals for each set of latches to be accessed serially. As such, the use of ripple clocks and a single data latch for each memory cell may not reduce the number of transistors needed in an overall memory device.

Therefore, what is needed is a system and a method which enables bits to be written efficiently into and read efficiently from memory cells without requiring a relatively high number of components such as transistors. That is, what is desired is a system and a method for reducing the overhead associated with writing bits into and reading bits from a multi-state memory cell while enabling the writing and the reading to occur efficiently.

SUMMARY OF THE INVENTION

The present invention relates to a system and a method for efficiently writing data to and reading data from memory cells. According to one aspect of the present invention, a memory system includes a first storage element, a data source, a first element, a second element, and a ripple clock. The data source provides a plurality of bits to be stored in the first storage element, and the first element receives a first bit from the data source, and also clocks the first bit into the second element The first element then receives a second bit of the plurality of bits from the data source substantially while the first bit is being stored into the first storage element. The ripple clock enables access to the first element and the second element such that the first bit and the second bit may be pipelined.

In one embodiment, the ripple clock also allows substantially concurrent access to the first storage element and at least a second storage element included in the plurality of storage elements. In another embodiment, the first buffering element is a first latch and the second buffering element is a second latch.

The use of a plurality of buffering elements such as latches to pipeline data bits either into or out of a multi-state memory cell allows write and read operations, respectively, to occur more efficiently. As such, the overhead cost of multi-state storage may be reduced. By loading a bit into a second latch associated with a group of memory cells while a bit is being written from a first latch into the memory cell, the time associated with loading the bit into the second latch may effectively be masked. Hence, an overall write process may occur more efficiently.

According to another aspect of the present invention, a computing system includes a host that provides a first bit and a second bit, and a storage device that is in communication with the host. The storage device includes a first storage element which clocks the first bit into a second buffering element. The first buffering element receives the second bit from the host substantially while the first bit is being stored into the first storage element by the second buffering element. Finally, the storage device includes a ripple clock that enables access to the first buffering element and the second buffering element.

In accordance with still another aspect of the present invention, a method for storing a plurality of bits in a memory system that includes a storage element, a first buffering element, and a second buffering element involves receiving the plurality of bits, and providing a first bit included in the plurality of bits to the first buffering element. A write process is then initiated to write the first bit into the storage element, and a second bit included in the plurality of bits is provided to the second buffering element after the write process to write the first bit into the storage element is initiated. The write process to write the first bit into the storage element after the second bit is provided to the second buffering element is then completed.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Reducing the overhead associated with reading bits from and writing bits into a multi-state storage element, e.g., by reducing the number of transistors needed to read and write bits, enables the performance of an overall storage system that includes the memory cell to be enhanced. As read and write operations, particularly write operations, are typically time consuming, reducing the time associated with the read and write operations may significantly reduce the overhead cost associated with multi-state storage operations.

Allowing bits to be pipelined using a plurality of latches in read and write processes associated with a multi-state storage element allows the speed with which the read and write processes may occur to increase. By enabling pipelining using the plurality of latches to occur by incorporating a ripple clock, the efficiency of read and write processes may be increased while the number of transistors associated with an overall storage system that includes the storage element may be reduced.

Figure 1A:
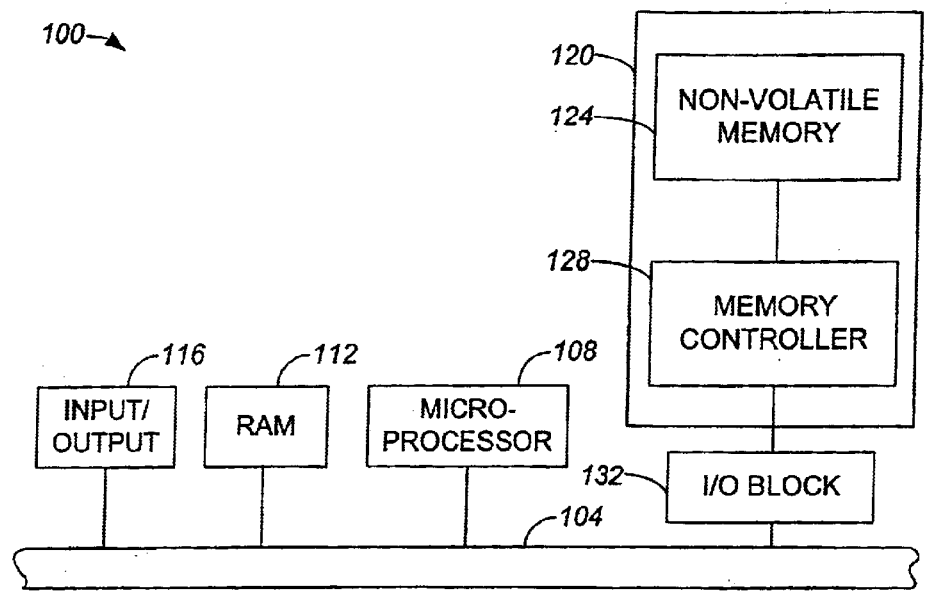
FIG. 1a is a diagrammatic representation of a general host system which includes a non-volatile memory device in accordance with an embodiment of the present invention.

Data are typically stored into a storage system, e.g., a non-volatile memory device, by a host which is in communication with the storage system. Referring initially to FIG. 1a, a general host system which includes a non-volatile memory device 120, e.g., a CompactFlash memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information.

A non-volatile memory device 120 which, in one embodiment, is a removable non-volatile memory device, is arranged to interface with bus 104 to store information. An optional input/output circuit block 132 may allow non-volatile memory device 120 to interface with indirectly with bus 104. When present, input/output circuit block 132 serves to reduce loading on bus 104, as will be understood by those skilled in the art. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or on multiple discrete components which may be used together as non-volatile memory device 120.

Non-volatile memory 124 is arranged to store data such that data may be accessed and read as needed. Data stored in non-volatile memory 124 may also be erased as appropriate, although it should be understood that some data in non-volatile memory 124 may not be erased. The processes of storing data, reading data, and erasing data are generally controlled by memory control system 128. In one embodiment, memory control system 128 manages the operation of non-volatile memory 124 such that the lifetime of non-volatile memory 124 is substantially maximized by essentially causing sections of non-volatile memory 124 to be worn out substantially equally.

Non-volatile memory device 120 has generally been described as including a memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. Generally, other types of non-volatile memory devices include Memory Stick cards and SmartMedia cards.

Figure 1B:
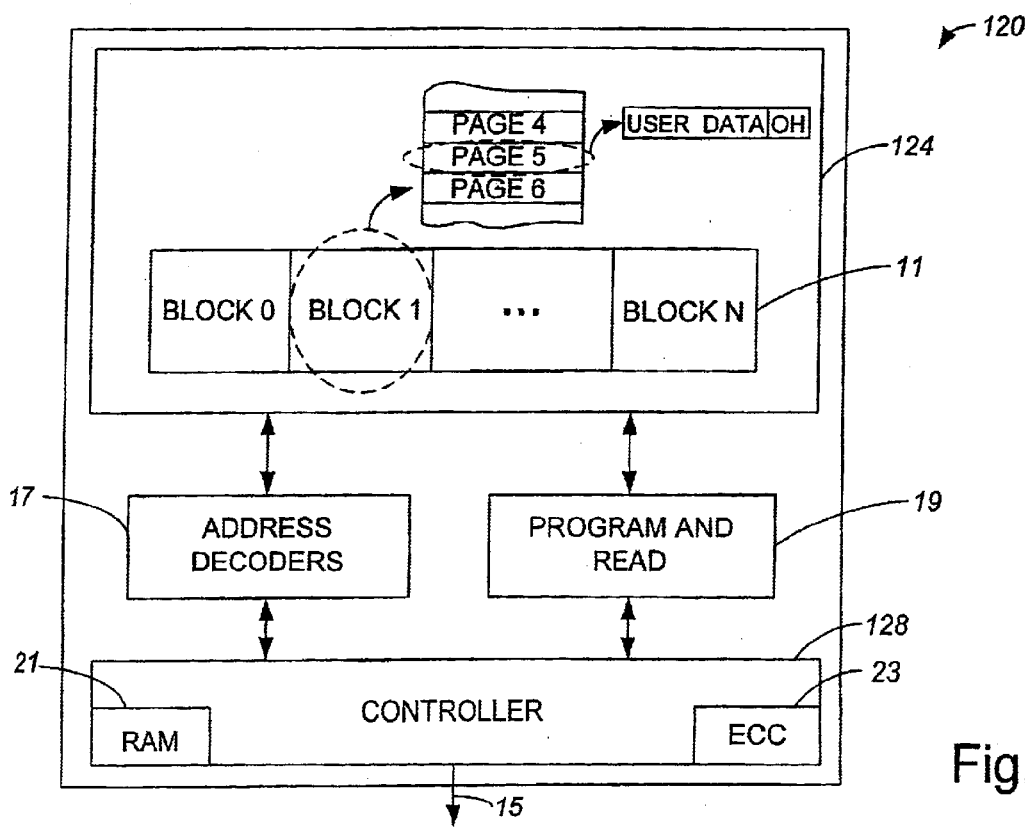
FIG. 1b is a diagrammatic representation of a non-volatile memory device, i.e., non-volatile memory device 120 of FIG. 1a, in accordance with an embodiment of the present invention.

With reference to FIG. 1b, non-volatile memory device 120 will be described in more detail in accordance with an embodiment of the present invention. As described above, non-volatile memory device 120 includes non-volatile memory 124 and memory control system 128. Memory 124 and control system 128, or controller, are primary components of non-volatile memory device 120. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated software memory and various logic circuits. One or more state machines are often also included for controlling the performance of specific routines.

Memory cell array 11 is typically addressed by control system 128 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Figure 3:
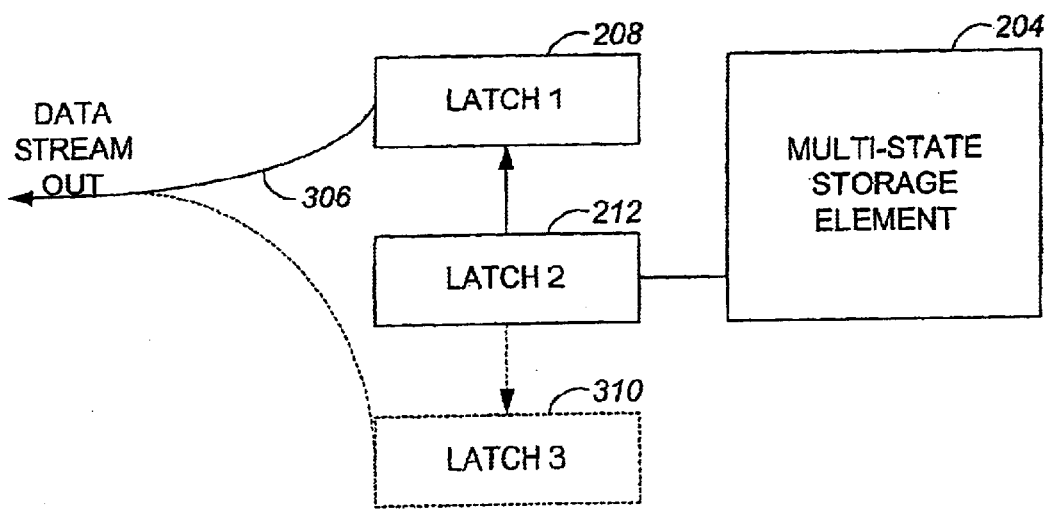
FIG. 3 is a diagrammatic representation of a non-volatile memory storage element, i.e., non-volatile storage element 204 of FIG. 2, which allows data bits to be retrieved from the non-volatile storage element through latches that effectively operate in parallel in accordance with an embodiment of the present invention.

Array 11 is divided into a large number of BLOCKS 0–N of memory cells. As is common for flash EEPROM systems, the block is the unit of erase. That is, each block contains the minimum number of memory cells that are erased together. Each block is typically divided into a number of pages, as also illustrated in FIG. 3. A page is the unit of programming. That is, a basic programming operation writes data into a minimum of one page of cells. One or more sectors of data are typically stored within each page. As shown in FIG. 1b, one sector includes user data and overhead data. Overhead data typically includes an error correction code. (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from eight pages, for example, up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Figure 2:
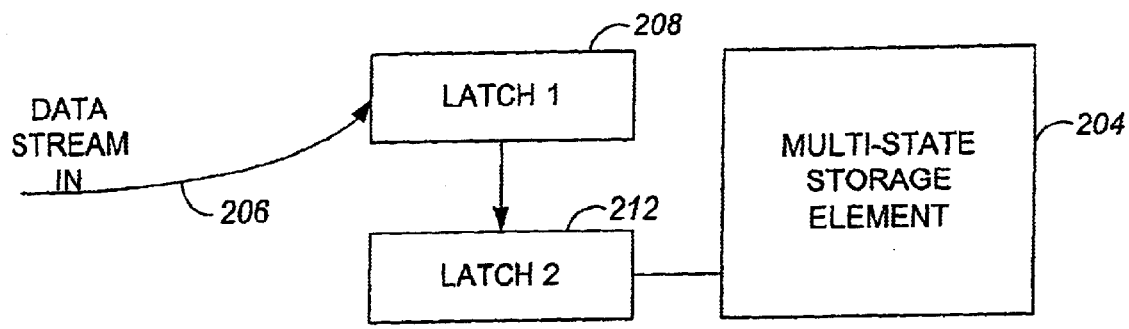
FIG. 2 is a diagrammatic representation of a non-volatile memory storage element which receives data bits to be written into a storage element through latches that effectively operate in parallel in accordance with an embodiment of the present invention.

Referring next to FIG. 2, a non-volatile memory storage element which receives data bits through latches that effectively operate in parallel will be described in accordance with an embodiment of the present invention. Although any number of latches may be used, for ease of discussion, FIG. 2 will be described in reference to the use of two latches, e.g., in a two-bit system. A non-volatile memory storage element 204, which may be part of a non-volatile memory system, e.g., non-volatile memory system 120 of FIG. 1a, is a basic unit of data storage that stores bits of data. It should be appreciated that a storage element such as storage element 204 is a basic unit of storage within a memory system. In one embodiment, storage element 204 may be a cell or a memory cell, although storage element 204 may be substantially any type of unit of storage.

When a data bit stream 206 is to be stored into storage element 204, data bit stream 206 is effectively temporarily held in or loaded into latches 208, 212 before being written to storage element 204. For example, a first bit in stream 206 may be loaded into latch 208, and then transferred into latch 212 by a parallel shift operation. While the first bit is substantially being written from latch 212 into storage element 204, the next bit in stream 206 may be loaded into latch 208. Hence, the use of latches 208, 212 enables bits in stream 206 to be pipelined, thereby enabling the write performance associated with writing bits into storage element 204 to be improved. As will be described below with reference to FIG. 5, the use of a ripple clock enables latches 208, 212 to pipeline bits associated with stream 206.

The use of latches 208, 212, in lieu of one latch, e.g., latch 208, allows data to be efficiently loaded for storage within storage element 204. In addition to reducing the number of transistors needed in an overall storage device, the pipelining associated with latches 208, 212 enables the write time associated with writing data into storage element 204 to be substantially reduced. By way of example, a write operation to write a bit from latch 212 into storage element 204 may occur in approximately 100 microseconds ($\mu s$). During the 100 $\mu s$ is generally needed to write a bit from latch 208 into storage element 204, another bit may be loaded into latch 208. As will be understood by those skilled in the art, with the exception of loading the initial bit into latch 208, the time associated with loading bits into latches 208, 212 is effectively "hidden," since the loading of bits into latches 208, 212 occurs substantially in parallel with write operations.

Typically, only latch 212 writes data into storage element 204. Although both latches 208, 212 may be arranged to write data into storage element 204, allowing only one latch, i.e., latch 212, to write to storage element 204 substantially simplifies circuitry associated with latches 208, 212. In addition, specific voltage requirements associated with writing bits to storage element 204 may be applied only to latch 212, rather than to both latches 208, 212.

In order to save space on a storage device, latches 208, 212 may also be used to temporarily hold data that are to be read out of storage element 204. That is, latches 208, 212 may serve to substantially buffer data that are to be written and data that are to be read. As shown in FIG. 3, when data are to be read out of storage element 204, data may be latched into latches 208, 212, and an output data stream 306 may be created when data are read out of latches 208, 212. Typically, a first bit read from storage element 204 may be loaded into latch 212, then clocked into latch 208. After the first bit is transferred into latch 208, the next bit is read from storage element 204 and loaded into latch 212 such that the next bit is effectively pipelined with respect to the first bit. Then, the bits may be read out of latches 208, 212 by a ripple clock. As a result, the performance associated with a read operation may be improved.

An optional third latch 310 may be used, as shown, such that after a first bit is loaded into latch 212 and shifted into latch 208, a second bit may be loaded into latch 212 and shifted into latch 310. Once latches 208, 310 are loaded, a ripple clock may cause the first bit and the second bit to be read out of latches 208, 310. That is, once latches 208, 310 are full, bits may be read out of latches 208, 310. When latches 208, 310 are empty, bits are once again read from storage element 204 and shifted into latches 208, 310. In general, when storage element 204 is a two-bit system, two latches are preferably used to store data before data is read out. By way of example, latches 208, 310 may both be used to store bits before bits are read out, while latch 212 effectively serves as a gate. Alternatively, latch 310 may be eliminated, and latches 208, 212 may be the two latches that are used to store bits before bits are read out.

Figure 16:
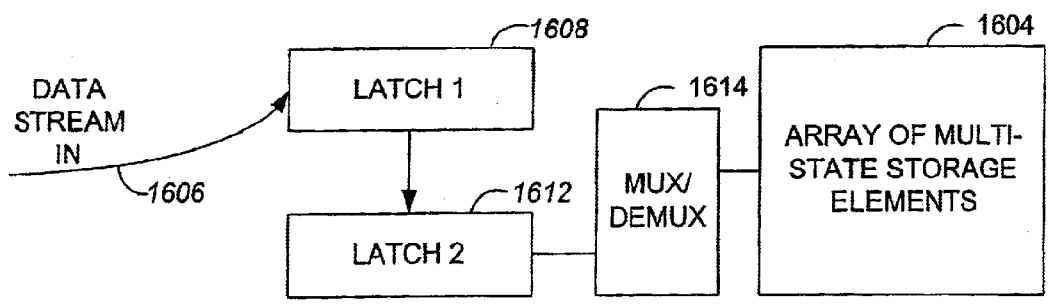
FIG. 16 is a diagrammatic representation of an array of non-volatile memory storage elements which receives data bits to be written into a storage element through latches that effectively operate in parallel in accordance with an embodiment of the present invention.
Figure 12:
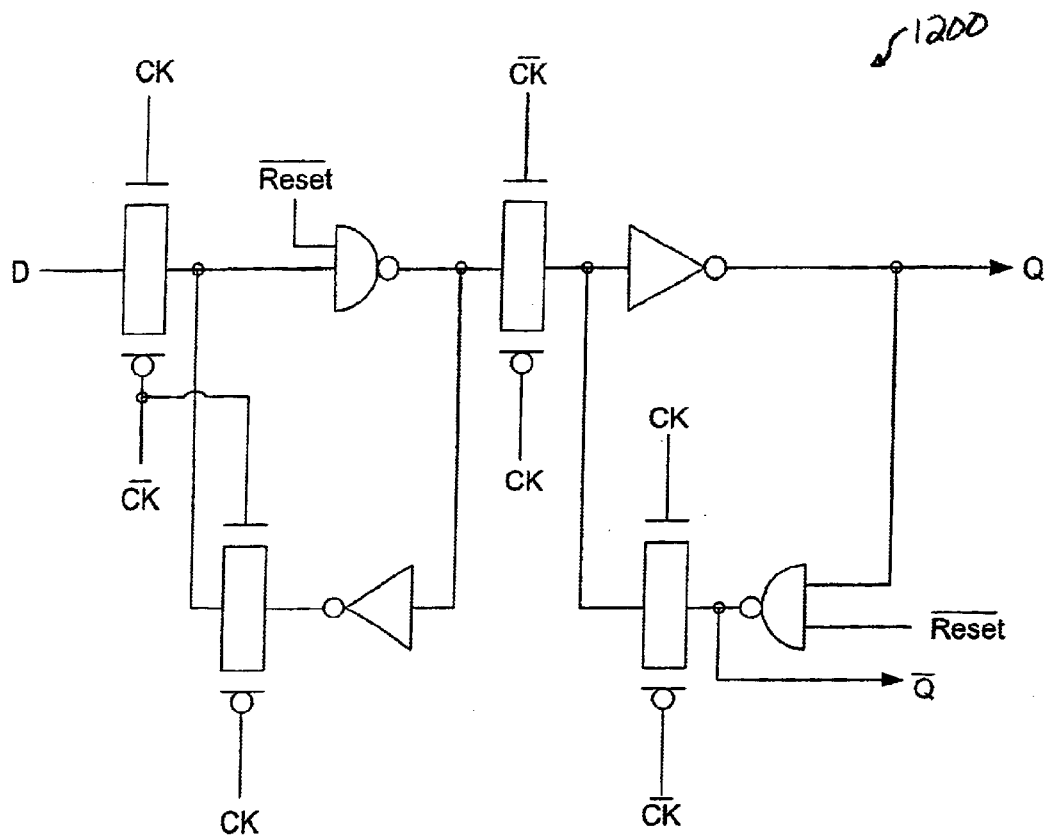
FIG. 12 is a diagrammatic representation of a master-slave register.
Figure 13A:
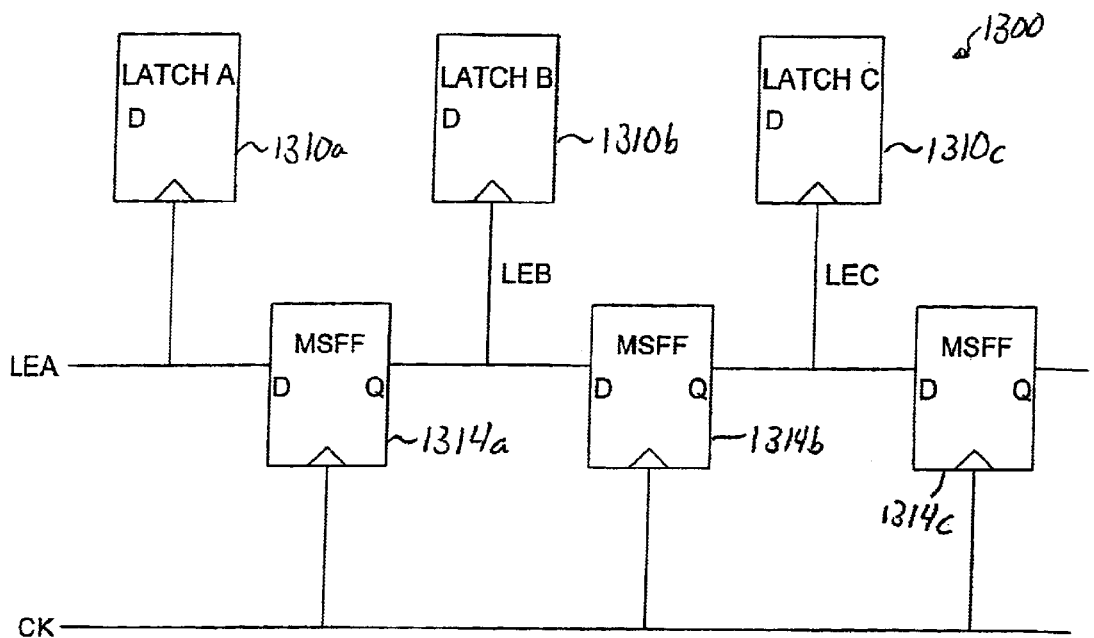
FIG. 13a is a diagrammatic representation of a set of data latches which are accessed by a ripple clock.
Figure 13B:
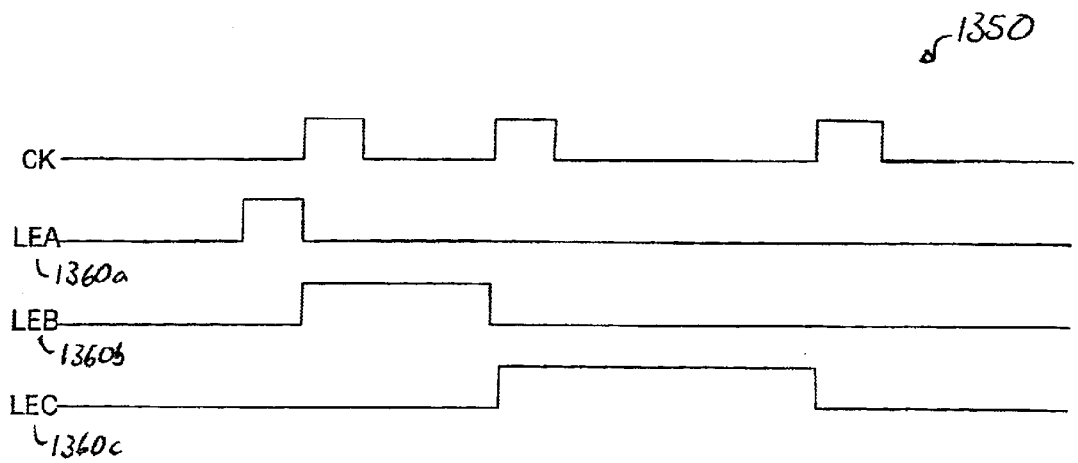
FIG. 13b is a timing diagram which illustrates a relationship between latch enable signals.

It should be appreciated that although a set of latches, e.g., latches 208, 212 of FIG. 2, may be associated with a single storage element such as storage element 204 of FIG. 2, a set of latches is typically associated with multiple storage elements. In other words, each set of latches is generally associated with an array of storage elements. It should be appreciated that an array of storage elements may include any number of storage elements. As shown in FIG. 16, an array of multi-state storage elements 1604, which may be part of a non-volatile memory system, may be arranged to store a data bit stream 1606. Data bit stream 1606 is effectively temporarily held in or loaded into latches 1608, 1612 before being written to array of storage elements 1604. A first bit in stream 1606 maybe loaded into latch 1608, and then transferred into latch 1612 by a parallel shift operation. While the first bit is substantially being written from latch 1612 into a storage element in array of storage elements 1604, the next bit in stream 1606 may be loaded into latch 1608.

Addressing circuitry 1614 is used to determine which storage element within array of storage elements 1604 a bit loaded in latch 1612 is to be stored into. Specifically, addressing circuitry 1614, which may include multiplexing and demultiplexing capabilities, is effectively used to select a storage element included in array of storage elements 1604 to connect to latch 1612.

Figure 4:
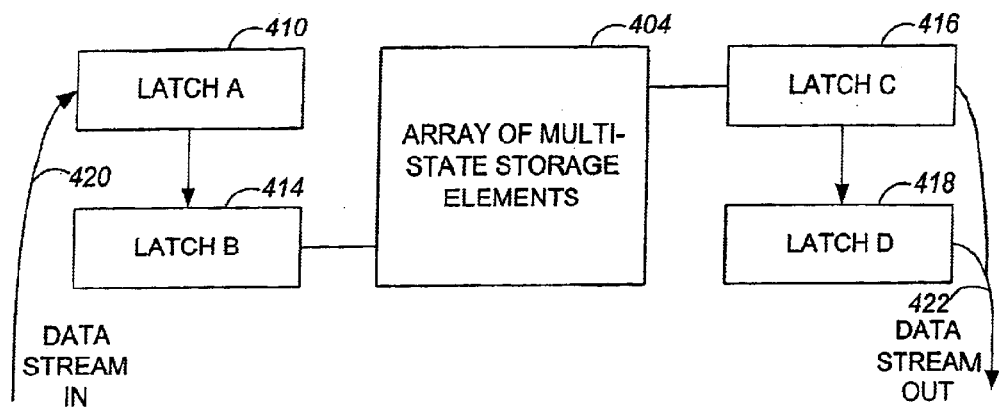
FIG. 4 is a diagrammatic representation of an array of storage elements with two write latches and two read latches in accordance with an embodiment of the present invention.

When requirements are such that a single set of latches which support both write and read operations is not sufficient to meet the requirements, then a set of "write" latches and a set of "read" latches may be assigned to a storage element or a memory cell. FIG. 4 is a diagrammatic representation of an array of storage elements with two write latches and two read latches in accordance with an embodiment of the present invention. When an input data stream 420 is to be written into a storage element within an array 404, bits of data included in stream 420 may be loaded into latch 410 and transferred into latch 414. As described above with respect to FIG. 2, a bit may be transferred into latch 414 such that while that bit is being written from latch 414 into storage element 404, another bit from stream 420 may substantially simultaneously be loaded into latch 410. Once the bit from latch 414 is written into a storage element in array 404, the bit loaded into latch 410 may be transferred or shifted into latch 414 and written into another storage element included in array 404 while, at substantially the same time, another bit from stream 420 is loaded into latch 410. Hence, latches 410, 414 enable bits in stream 420 to be pipelined and written efficiently into multiple storage elements within array 404.

Data that is to be read from array 404 may be loaded into latch 416 and shifted into latch 418. That is, a first bit that is stored in a storage element of array 404 may be loaded into latch 416, and clocked into latch 418. Then, a second bit from a different storage element may be loaded into latch 416. In the described embodiment, once latches 416, 418 are loaded, the bits may be streamed out as a part of an output data stream 422. Alternatively, as discussed above, latch 416 may serve as a gate that feeds latch 418 and another latch (not shown) such that data is substantially only streamed out of latch 418 and the other latch.

Figure 5:
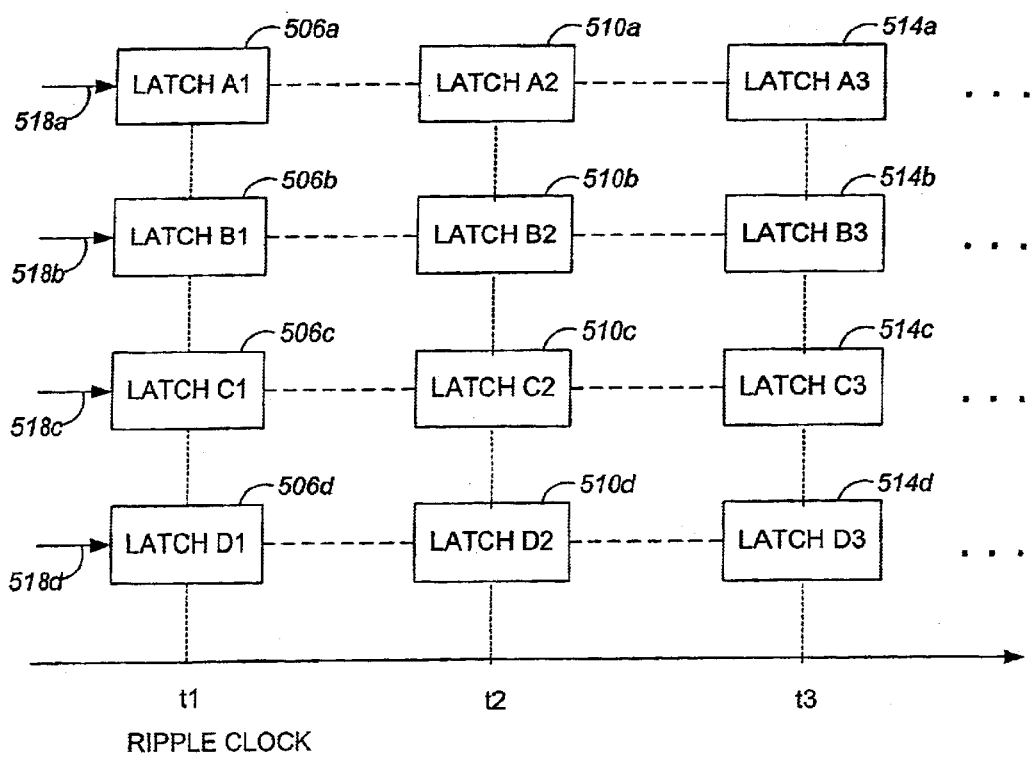
FIG. 5 is a diagrammatic representation of a timeline with latches which are accessed at various times through the use of a ripple clock in accordance with an embodiment of the present invention.

As mentioned above, a ripple clock may be used to enable latches such as latches 208, 212 of FIG. 2 to pipeline data. As shown in FIG. 5, which is a diagrammatic representation of a timeline associated with a ripple clock in accordance with an embodiment of the present invention, at a time t1 502a, a ripple clock enables access to latches 506 substantially in parallel. Hence, latches 506 may pipeline data when data/access control signals 518 allow individual bit access to each latch 506. Typically, a ripple clock uses a master-slave latch to enable a set of latches, e.g., a set which includes latches 506, to be accessed in parallel. While such a master-slave latch may use multiple transistors, since substantially only one master-slave latch is needed for each ripple clock stage, and each ripple clock enables access to many latches, the use of a ripple clock to pipeline data reduces the overhead associated with writing to and reading from multi-state storage elements.

At a time t2 502b, the ripple clock enables access to latches 510 substantially in parallel. At a time t3 502c, the ripple clock enables access to latches 514 using data/access control signals 518 substantially concurrently. It should be understood that once all groups of latches, namely latches 502, latches 506, and latches 510, have been enabled by the ripple clock; the ripple clock may cycle back to once again enable parallel access to the groups of latches. That is, at a time t4 (not shown), for example, the ripple clock may enable access to latches 510 substantially in parallel.

The ripple clock enables a stage or a group of latches, e.g., latches 502, to be accessed in parallel. For example, when latches 502 are accessed in parallel, data may be read out of latches 502 by receiver, or data may be put into latches 502 by a data source. In other words, a ripple clock enables parallel reads to occur within a group of latches and also allows data to be substantially simultaneously extracted from the group of latches. At different times 502, different groups of latches are enabled in parallel.

The use of a ripple clock generally prevents data that are stored using multiple latches from being accessed randomly. However, the reduction of overhead, e.g., the reduction in the number of transistors needed to write and retrieve data, that occurs when a ripple clock is used to enable pipelining to be realized typically renders the use of a ripple clock and a plurality of latches to write and read data to be desirable. In particular, when random access to data that are stored using multiple latches is effectively not required, then the savings associated with a reduction in the number of transistors needed to store data is particularly desirable.

Figure 6A:
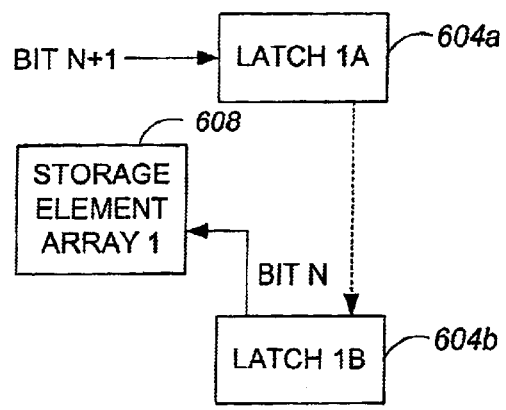
FIG. 6a is a diagrammatic representation of an array of storage elements and latches with input bits in accordance with one embodiment of the present invention.

FIG. 6a is a diagrammatic representation of a storage element array and latches during a write operation in accordance with an embodiment of the present invention. latches 604 are associated with a storage element array 608, and are arranged to store bits into array 608. In the described embodiment, after a bit N is first loaded into a latch 604a, as for example when a ripple clock enables latch 604a, a parallel shift may be performed to move bit N from latch 604a into latch 604b, after which time a bit N+1 may be loaded into latch 604a. From latch 604b, bit N may then be written into a storage element in array 608.

Figure 6B:
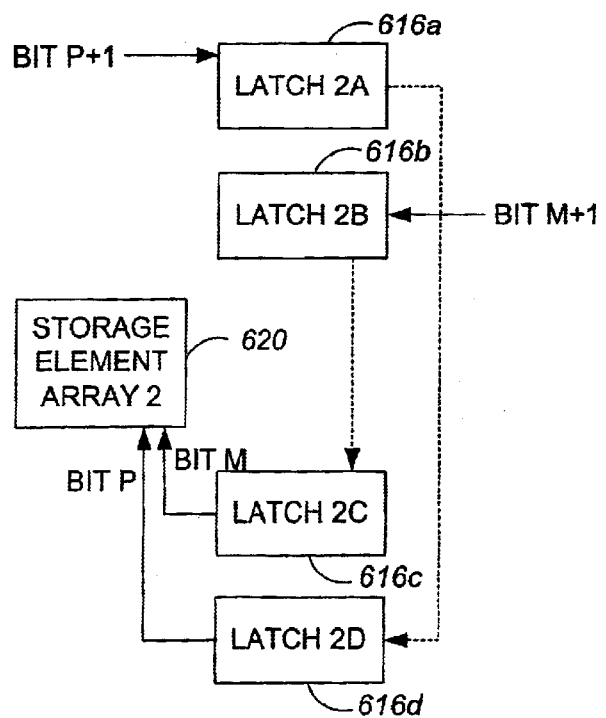
FIG. 6b is a diagrammatic representation of an array of storage elements and latches with input bits in accordance with one embodiment of the present invention.

FIG. 6b is a diagrammatic representation of a single storage element array and multiple latches which have access to the storage element array during a write operation in accordance with an embodiment of the present invention. A ripple clock may enable latches 616a, 616b to be loaded substantially simultaneously. For example, a bit P+1 and a bit M+1 may be substantially simultaneously loaded into latch 616a and latch 616b, respectively. In one embodiment, bits loaded into latches 616a, 616b may be provided to latches 616d, 616c through a parallel shift. Bits, e.g., bit M and bit P, may then be stored substantially simultaneously into a storage element in array 620. Alternatively, bit M and bit P may be stored sequentially into a storage element in array 620. One suitable method for storing bit M and bit P into a storage element is described in U.S. Pat. No. 6,222,762B1, which is incorporated herein by reference in its entirety. In general, while bit M and bit P are stored into a first storage element associated with array 620, bit M+1 and bit P+1 are loaded into latch 616a and latch 616b, respectively.

Although a parallel shift may load a bit from latch 616a into latch 616d substantially at the same time that a bit is loaded from latch 616b into latch 616c, it should be appreciated that the bits may be loaded sequentially. For instance, if a reduction in electrical noise is desired, loading a bit from latch 616a into latch 616d may occur either before or after a bit from latch 616b is loaded into latch 616c.

Figure 7:
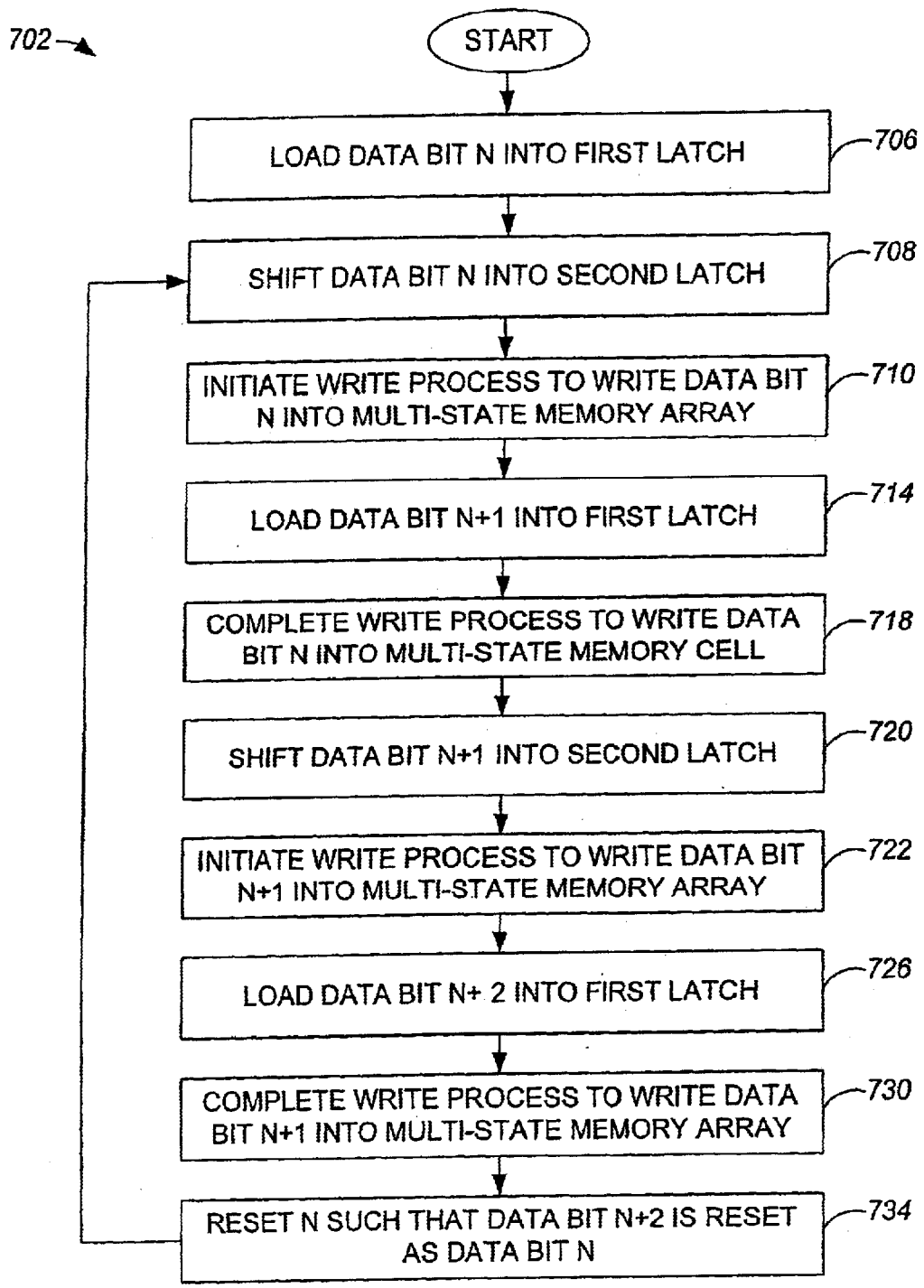
FIG. 7 is a process flow diagram which illustrates the steps associated with one method of writing data to an array of multi-state storage elements using two data latches in accordance with an embodiment of the present invention.

With reference to FIG. 7, the steps associated with one method of writing data to a binary or multi-state storage element array which includes a memory cell using two data latches will be described in accordance with an embodiment of the present invention. It should be understood that although steps associated with writing data are described in terms of writing data to a memory cell using two latches, the steps may be implemented with respect to writing data to substantially any storage element using any number of latches, e.g., eight latches. A process 702 of writing data to a multi-state memory cell array or, more generally, a non-volatile memory storage element array, begins at step 706 in which a data bit N that is to be written to a memory cell in the array is loaded into a first latch associated with the array. In other words, a first bit from a data stream is loaded into the first latch. Data bit N may be received by the first latch from substantially any source, e.g., a host system. Once data bit N is loaded into the first latch, data bit N is shifted into a second latch in step 708 by an operation such as a parallel shift operation A write process is then initiated in step 710 to write data bit N into the memory cell array from the second latch.

At substantially the same time that a write process is initiated to write data bit N into the memory cell array, the next data bit in the data stream is stored into the first latch associated with the memory cell array. That is, in step 714, data bit N+1 is loaded into the first latch. Hence, data bit N and data bit N+1 are effectively pipelined. After data bit N+1 is loaded into the first latch in step 714, the write process that was initiated in step 710 is completed, i.e., the write process to write data bit N into the memory cell array is completed, in step 718.

Upon completion of the write process in step 718, data bit N+1 is shifted or loaded from the first latch into the second latch in step 720. A write process is then initiated in step 722 to write data bit N+1, which is stored in the second latch, into the memory cell array. When the write process to write data bit N+1 into the memory cell array is initiated, a subsequent data bit in the data stream may be loaded into the first latch 726. In the described embodiment, data bit N+2 is loaded into the first latch in step 726. Once data bit N+2 is loaded into the first latch, the write process to write data bit N+1 into the memory cell array is completed in step 730. Then, in step 734, the value of N is effectively reset, e.g., data bit N+2 is initialized to be the new data bit N, and process flow returns to step 708 in which data bit N, ie., the new data bit N, is shifted from the first latch into the second latch.

Figure 8:
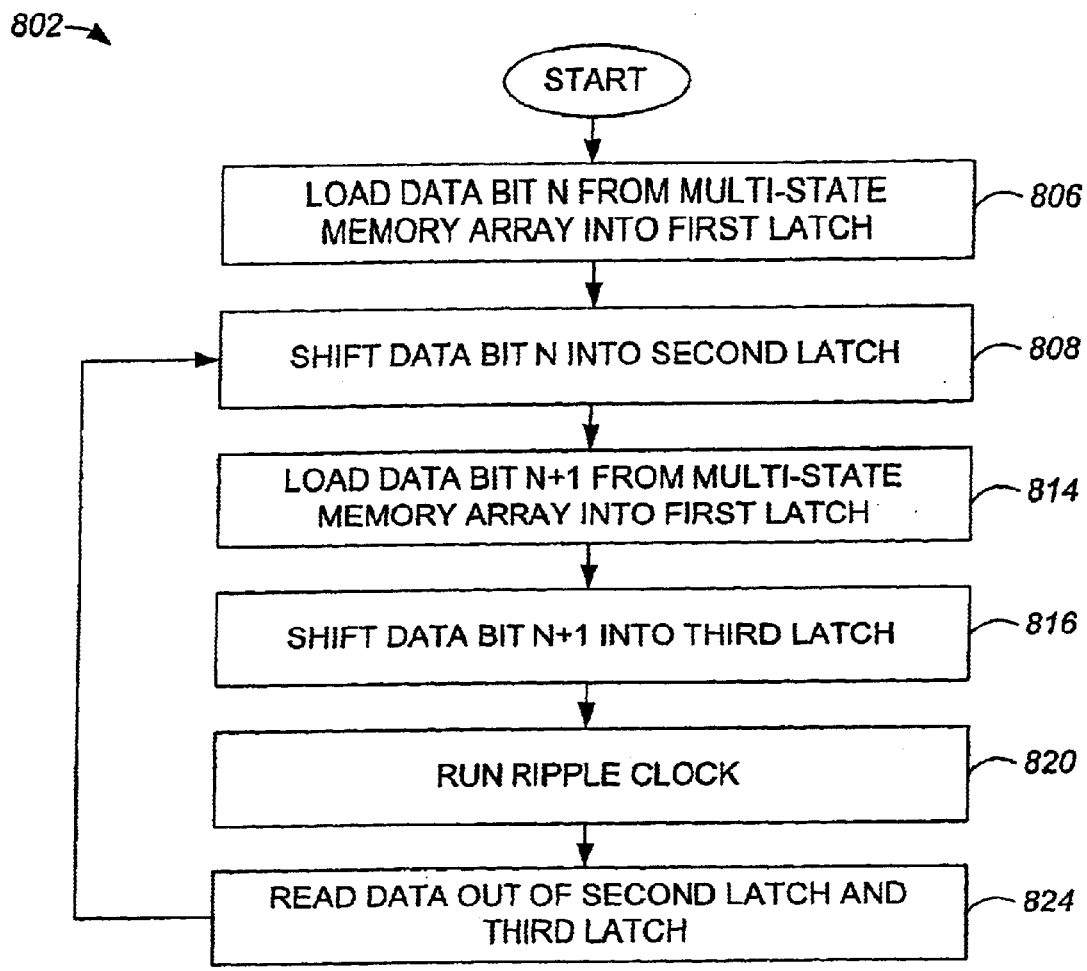
FIG. 8 is a process flow diagram which illustrates the steps associated with one method of reading data from an array of multi-state storage elements using two data latches in accordance with an embodiment of the present invention.

FIG. 8 is a process flow diagram which illustrates the steps associated with reading data stored in a binary or multi-state memory cell array into latches in accordance with an embodiment of the present invention. In the described embodiment, three latches are used to read data from the multi-state memory cell array which generally includes a plurality of memory cells. A process 802 begins at step 806 in which a first data bit N is obtained from the memory cell array or, more generally, an array of storage elements, and loaded into a first latch associated with the memory cell array. In one embodiment, as pictured in FIGS. 2 and 3, the first data latch may also be used to load data which is to be stored into the memory cell array, as well as to load data that is to be obtained from the memory cell array. Alternatively, as shown in FIG. 4, the first data latch used to load data obtained from the memory cell array may substantially only be used to load data from the memory cell array.

Once data bit N is loaded into the first latch which, in one embodiment, effectively serves as a gate, data bit N is transferred from the first latch into a second latch in step 808. At substantially the same time that data bit N is transferred into the second latch, data bit N+1 is loaded from the memory cell array into the first latch in step 814. After data bit N+1 is loaded into the first latch, data bit N+1 is transferred into a third latch in step 816.

In step 820, a ripple clock is allowed to run. The ripple clock generally runs to enable bits to be streamed out of the second latch and the third latch. As such, in step 824, data is read out of the second latch and the third latch. Data may be substantially pipelined. Once bits are read out of the second latch and the third latch in step 824, process flow returns to step 806 in which a new data bit N is loaded from the memory cell array into the first latch.

Figure 9:
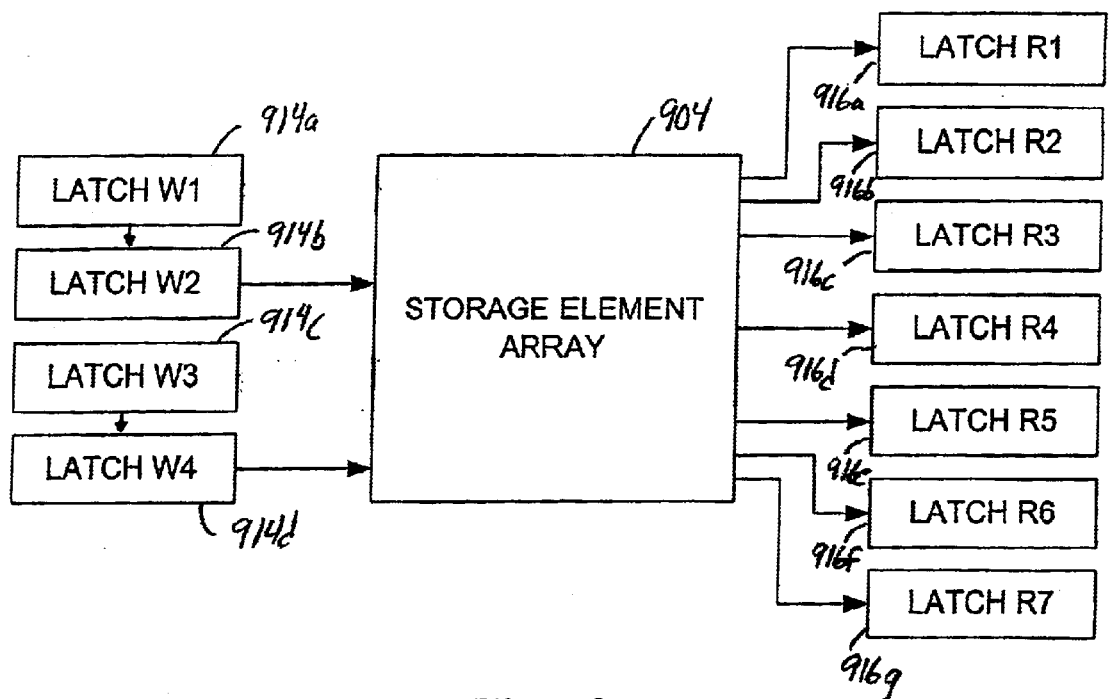
FIG. 9 is a diagrammatic representation of an array of storage elements which includes multiple read latches and multiple write latches in accordance with an embodiment of the present invention.

In one embodiment, four bits of data may be written into a storage element as four bits, but read to a higher precision, e.g., read as seven bits. The reading of four stored bits as seven bits, then translating the seven bits back into four bits, is described in copending U.S. patent application Ser. No. 10/152,137 entitled "Increasing the Effectiveness of Error Correction Codes and Operating Multi-level Memory Systems by Using Information About the Quality of the Stored Data", filed concurrently herewith, which is incorporated herein by reference in its entirety. To facilitate the storage of bits into a storage element and the retrieval of bits from the storage element in such an embodiment, four dedicated write latches and seven dedicated read latches may be implemented with respect to the storage element. FIG. 9 is a diagrammatic representation of a storage element which includes multiple read latches and multiple write latches in accordance with an embodiment of the present invention. A storage element 904 has four write latches 914 which are arranged to load bits provided by a data source (not shown), e.g., a host system (not shown) which is in communication with storage element 904.

Bits may be loaded into write latches 914 before the bits are written into storage element 904. As previously mentioned, four bits written into storage element 904 using latches 914 may be read out of storage element 904 as seven bits. Hence, in the embodiment as shown, seven read latches 916 are used to read seven bits from storage element 904.

Figure 10:
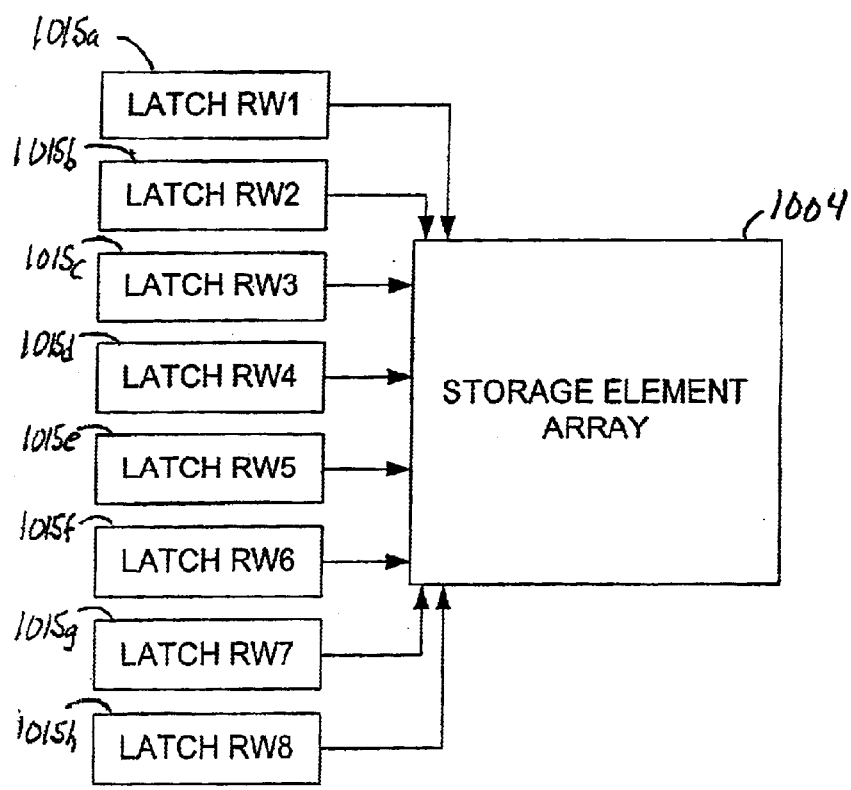
FIG. 10 is a diagrammatic representation of a storage element array which is associated with latches that serve to temporarily store bits that are to be written and bits that are to be read in accordance with an embodiment of the present invention.

When four bits of data is stored and read out as seven bits of data or, more generally, when a number of stored bits is read out of a storage element as a higher number of bits, latches which serve to temporarily store data to be written into the storage element may also serve as latches which temporarily store data as the data is being read out from the storage element. That is, rather than having dedicated read latches and write latches, as discussed above with respect to FIG. 9, a storage element which stores a number of bits that are read out as a higher number of bits may have shared read and write latches. With reference to FIG. 10, a storage element which is associated with latches which serve to temporarily store bits that are to be written and bits that are to be read will be described in accordance with an embodiment of the present invention. A storage element 1004 is arranged to store four bits which are read out as seven bits, although it should be understood that the number of bits stored and the number of bits read out may generally vary widely.

In general, to accommodate the need for reading out seven bits, storage element 1004 is associated with seven latches 1015*a–g*. Latches 1015*a–g* may serve as temporary buffers for bits that are read out from storage element 1004. Typically, any four of latches 1015*a–g* may serve as temporary buffers for bits that are to be written into storage elements 1004.

As will be appreciated by those skilled in the art, write operations are generally more time consuming than read operations. Hence, pipelining bits that are to be written into storage element 1004, even without pipelining bits that are to be read from storage element 1004, may increase the overall efficiency associated with storing information into storage element 1004. Bits may be pipelined into storage element by using four latches, e.g., latches 1015*a–d,* as write latches during write operations, and using three latches, e.g., latches 1015*e–g,* for pipelining. That is, latches 1015*e–g* may each serve as latches which may be loaded while bits are being written from latches 1015*a–d* into storage element 1004. In the embodiment as shown, an eight latch 1015*h* maybe associated with storage element 1004. Latch 1015*h,* in addition to latches 1015*e–g,* may serve as four pipelining latches for latches 1015*a–d,* and vice versa. The use of four latches, i.e, latches 1015*e–h,* as pipelining latches with respect to four latches 1015*a–d* enables each of latches 1015*a–d* to have an associated pipelining latch, thereby enabling four bits to be written into storage element 1004 at substantially the same time. Similarly, latches 1015*a–d* may serve as pipelining latches for latches 1015*e–h*. The use of eight latches to enable bits to be pipelined for writing into a storage element will be described below with respect to FIG. 14. Latch 1015*h* may be substantially dedicated to write processes associated with storage element 1004. That is, latch 1015*b* may be used during a write operation, but remain essentially unused during a read operation, as a read operation arranged to read seven bits uses latches 1015*a–g*. Alternatively, a read operation may be modified to read four stored bits as eight bits, in which case latches 1015*a–h* may all be used for both write operations and read operations.

In general, latch 1015*h* may be dedicated for use with storage element 1004. However, since latch 1015*h* may, in one embodiment, be used substantially only with respect to write operations, latch 1015*h* may be "shared." By way of example, in addition to being used to facilitate the storage of information in storage element 1004, latch 1015*h* may also be used to facilitate the downloading of information into a buffer. That is, latch 1015*h* may be used as a part of a sensing arrangement.

Figure 11:
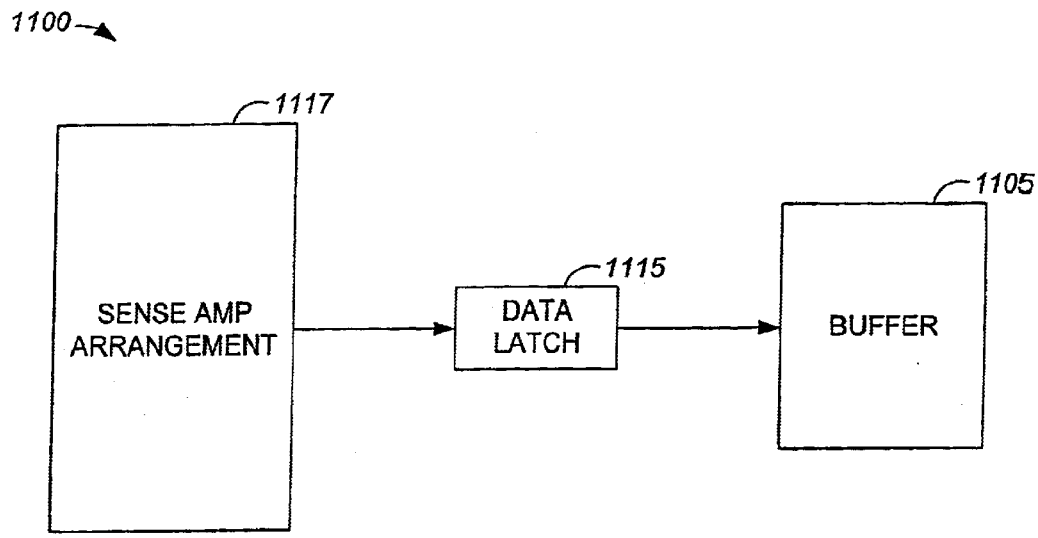
FIG. 11 is a diagrammatic representation of a sensing arrangement which includes a latch in accordance with an embodiment of the present invention.

FIG. 11 is a diagrammatic representation of a sensing arrangement which includes a latch in accordance with an embodiment of the present invention. A sensing arrangement 1100 is generally arranged to provide information that is stored in a memory cell array (not shown) to a buffer 1105, or a data latch. Data that is retrieved from the memory cell may be processed by a sensing amplifier or sensing amplifiers within a sensing amplifier arrangement 1117. Typically, bits are read from the memory cell array serially, with the most significant bit being read first.

In the described embodiment, a latch 1115 is arranged to latch the output of sensing amplifier arrangement 1117, prior to downloading the output into buffer 1105. The use of latch 1115 typically serves to reduce noise sensitivity by latching data during each phase of a multi-pass read. While latch 1115 may be associated with a read process involving a storage element or memory cell, latch 1115 may also serve a purpose during a write process. By way of example, latch 1115 may serve as latch 1015*h* of FIG. 10 during a write process. That is, in addition to latching data provided by sensing amplifier arrangement 1117 during an overall read process, latch 1115 may be used as a pipelining latch during a write process involving the memory cell which provides the data to sensing amplifiers 1117.

Figure 14:
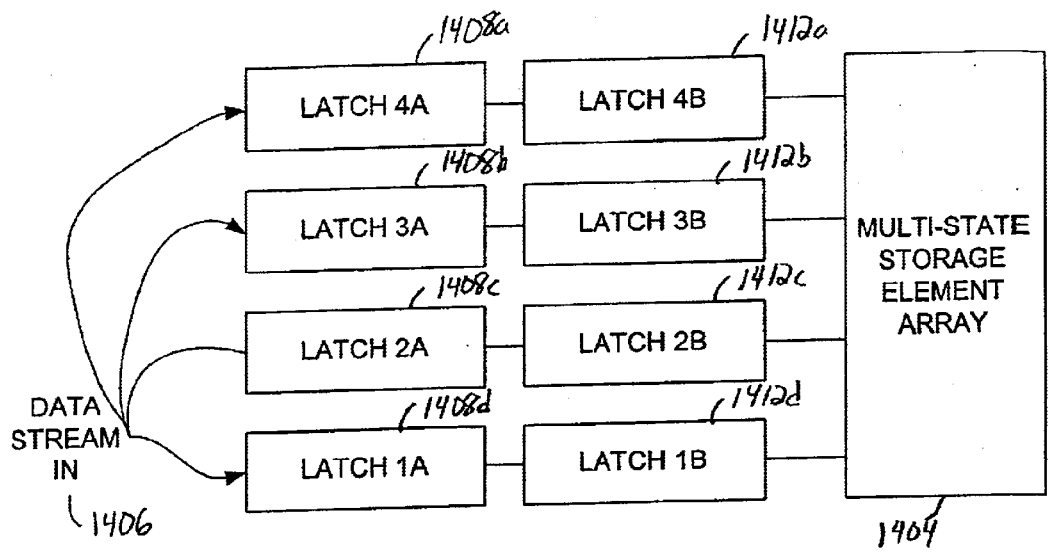
FIG. 14 is a diagrammatic representation of a non-volatile memory storage element array which receives data bits through a set of eight latches which operate in parallel in accordance with an embodiment of the present invention.

FIG. 14 is a diagrammatic representation of a non-volatile memory storage element array which receives data bits through a set of eight latches that effectively operate in parallel in accordance with an embodiment of the present invention. A non-volatile memory storage element array 1404 may include multi-state storage elements, although storage element array 1404 may include substantially any type of storage elements, e.g., binary storage elements. When a data bit stream 1406 is to be stored into storage element array 1404, data bit stream 1406 may be loaded into latches 1408, 1412 before being written to storage element array 1404. For example, a first bit in stream 1406 may be loaded into latch 1408*a* and then transferred into latch 1412*a* by a parallel shift operation, while a second bit in stream 1406 may be loaded into latch 1408*b* and then transferred into latch 1412*b* by a parallel shift operation. While the first bits are substantially being written from latches such as latches 1412*a*, 1412*b* into storage element array 1404, the next bits in stream 1406 maybe loaded into latches 1408*a*, 1408*b*. In general, bits from stream 1406 may be loaded substantially simultaneously into latches 1408, and transferred using a parallel shift operation into latches 1412. Then, when the bits in latches 1412 are effectively stored into storage element 1404, the next bits in stream 1406 may be loaded into latches 1408, and transferred into latches 1412 using a parallel shift operation.

In the described embodiment, substantially only latches 1412 write data into storage element array 1404. While latches 1408, 1412 may be arranged to write data into storage element array 1404, allowing only one set of latches, namely latches 1412, to write to storage element array 1404 substantially simplifies circuitry associated with latches 1408, 1412.

Figure 15:
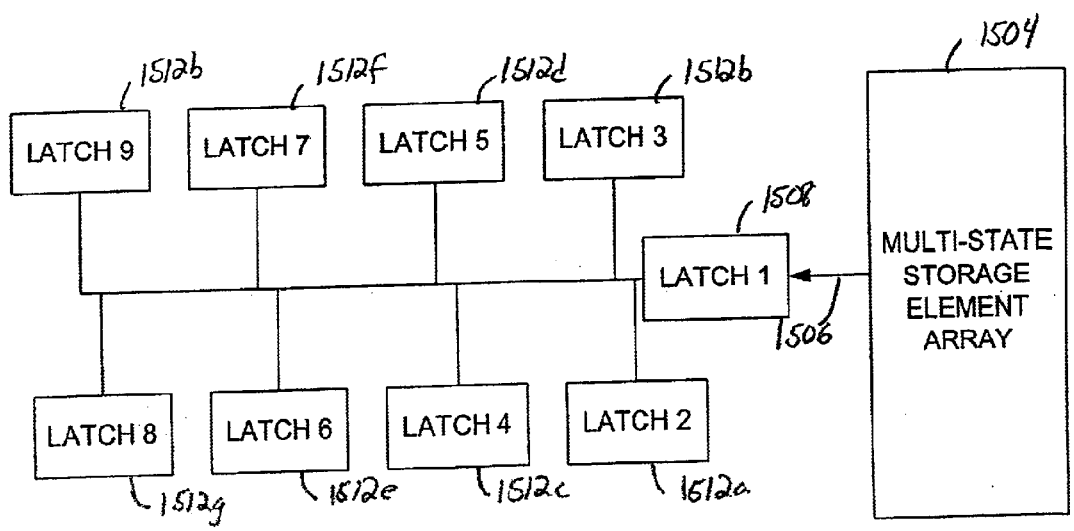
FIG. 15 is a diagrammatic representation of a non-volatile memory storage element array which provides data bits through a set of nine latches during a read operation in accordance with an embodiment of the present invention.

In general, the number of latches used to write data into a storage element array may be less than or equal to the number of latches used to read data from the storage element array. For example, if a non-volatile storage element array such storage element array 1404 of FIG. 14 has eight associated latches which store bits into storage element 1404 array, then storage element array 1404 may typically have eight or nine latches which read bits from storage element array 1404. FIG. 15 is a diagrammatic representation of a non-volatile memory storage element array which provides data bits through a set of nine latches during a read operation in accordance with an embodiment of the present invention. When data are to be read from a storage element array 1504 in a bit stream 1506, a first bit that is included in stream 1506 may be loaded into a latch 1508, then shifted into a latch 1512*a*. A subsequent second bit from stream 1506 maybe loaded into latch 1508 after the first bit is clocked into latch 1512*a* Such a second bit may then be shifted into a latch 1512*b* before a third bit is clocked into latch 1512*a* Loading bits into latch 1508 and shifting those bits into latches 1512 typically continues until substantially all latches 1512 are loaded, or until stream 1506 is substantially empty.

Once latches 1512 are loaded, the bits loaded therein may be read out of latches 1512 by a ripple clock. As a result, the performance associated with a read operation may be improved, since eight bits may be read out in parallel. In the described embodiment, latch 1508 effectively serves as a gate which allows bits to be loaded into latches 1512. It should be appreciated, however, that in one embodiment, latch 1508 may serve both as a gate and as a pipelining latch, e.g., a ripple clock may clock a bit substantially directly out of latch 1508. When latch 1508 includes pipelining capabilities, a latch 1512, e.g., latch 1512*h*, may be substantially eliminated, as latch 1508 and latches 1512*a–g* may correspond to latches 1408, 1412 of FIG. 14 in a system in which each latch is both a read latch and a write latch.

Although only a few embodiments of the present invention have been described, it should be understood that the present invention may be embodied in many other specific forms without departing from the spirit or the scope of the present invention. By way of example, a component within a memory device which buffers data that is being loaded into or retrieved from a storage element array within the memory device has generally been described as a latch. It should be appreciated, however, that substantially any suitable component which buffers data may be implemented instead of a latch.

As described above with respect to FIG. 4, dual sets of latches may be used to latch data that is to be written into a storage element array and to latch data that is being read out of the storage element array. That is, two latches may be configured for use as dedicated write latches, and two latches may be configured for use as dedicated read latches. Within an overall system in which a storage element array has two associated write latches and two associated read latches, when bandwidth requirements are such that two dedicated read latches are effectively not needed, all four of the latches may be used to buffer data being written into the storage element array. The two read latches may also be used to buffer data being read from the storage element array when data is not being written into the storage element array. Similarly, when bandwidth requirements within such a system at least temporarily do not effectively require two dedicated write latches, the two write latches may also be used as read latches.

In general, the steps associated with the processes of the present invention may be widely varied. Steps may be altered, reordered, added, or removed without departing from the spirit or the scope of the present invention. By way of example, processes used to read data from a storage element array and to write data to a storage element array may include tests to determine if there are additional bits that are to be retrieved or loaded, respectively. Further, when data is being clocked out of read latches, a bit may substantially simultaneously be loaded into a gate latch. Therefore, the present examples are to be considered as illustrative and not restrictive, and the invention is not to be limited to the details given herein, but may be modified within the scope of the appended claims.

What is claimed is:

1. A memory system, the memory system being suitable for storing data, the memory system comprising:
    a plurality of storage elements, the plurality of storage elements including a first storage element;
    a data source, the data source being arranged to provide a plurality of bits to be stored in the first storage element;
    a first element, the first element being arranged to receive a first bit included in the plurality of bits from the data source;
    a second element, the second element being arranged to receive the first bit from the first element, the second element further being arranged to store the first bit into the first storage element; and
    a ripple clock, the ripple clock being arranged to enable access to the first element and the second element substantially in parallel.

2. The memory system of claim 1 wherein the ripple clock is further arranged to allow access to the first storage element and at least a second storage element included in the plurality of storage elements substantially simultaneously.

3. The memory system of claim 1 wherein the first element is a first latch and the second element is a second latch.

4. The memory system of claim 1 wherein the first element is arranged to receive a second bit included in the plurality of bits from the data source substantially while the first bit is being stored into the first storage element.

5. The memory system of claim 4 wherein the second element is arranged to receive the second bit from the first element, the second element further being arranged to store the second bit into a second storage element included in the plurality of storage elements substantially while a third bit included in the plurality of bits is received by the first element from the data source.

6. The memory system of claim 1 wherein the first element is arranged to receive a second bit included in the plurality of bits from the data source after the first bit is stored into the first storage element.

7. The memory system of claim 1 wherein the memory system further includes a data receiver, and the first element is further arranged to receive a third bit from the first storage element and to provide the third bit to the data receiver.

8. The memory system of claim 7 wherein the plurality of storage elements includes a second storage element, and the second element is further arranged to receive a fourth bit from the second storage element substantially after the third bit is provided to the data receiver.

9. The memory system of claim 1 wherein the memory system is a non-volatile memory system.

10. The memory system of claim 9 wherein the non-volatile memory system is a memory card.

11. The memory system of claim 10 wherein the memory card is one of a PC card, a CompactFlash card, a MultiMedia card, a Secure Digital card, a Smart Media card, and a Memory Stick card.

12. The memory system of claim 9 wherein the first storage element is a non-volatile storage element.

13. A computing system comprising:
    a host, the host being arranged to provide a plurality of bits, the plurality of bits including a first bit and a second bit; and
    a storage device, wherein the storage device is in communication with the host, the storage device including
        an array of storage elements, the array of storage elements including at least one storage element,
        a first buffering element, the first buffering element being arranged to receive the first bit from the host
        a second buffering element, the second buffering element being arranged to receive the first bit from the first buffering element, the second buffering element further being arranged to store the first bit into the array, and
        a ripple clock, the ripple clock being arranged to enable access to the first buffering element and the second buffering element substantially in parallel.

14. The computing system of claim 13 wherein the ripple clock is further arranged to allow substantially concurrent access to the at least one storage element and at least a second storage element included in the array.

15. The computing system of claim 13 wherein the first buffering element is a first latch and the second buffering element is a second latch.

16. The computing system of claim 13 wherein the first buffering element is arranged to receive a third bit included in the plurality of bits from the host substantially while the second bit is being stored into the array.

17. The computing system of claim 13 wherein the second buffering element is further arranged to receive a third bit from the array and to provide the third bit to the host.

18. The computing system of claim 13 wherein the second buffering element is further arranged to receive a third bit from array and to provide the third bit to the first buffering element, wherein the first buffering element is arranged to provide the third bit to the host.

19. The computing system of claim 13 wherein the storage device is a non-volatile memory system and the at least one storage element is a non-volatile storage element.

20. The computing system of claim 19 wherein the storage device is one of a PC card, a CompactFlash card, a MultiMedia card, a Secure Digital card, a Smart Media card, and a Memory Stick card.

21. The computing system of claim 13 wherein the host system is arranged to capture information, the information including the plurality of bits, the information being one of still image information, audio information, video information, and information that is captured in a wireless manner.

22. The computing system of claim 21, wherein the host system is one of a digital camera, a video camera, a cellular communications device, and audio player, and a video player.

23. The computing system of claim 13 wherein the storage device is removable with respect to the host system.

24. A method for storing a plurality of bits in a memory system, the memory system including an array which includes at least one storage element, a first buffering element, and a second buffering element, the method comprising:

providing a first bit included in a plurality of bits to the first buffering element;

initiating a write process to write the first bit into the array, wherein initiating the write process to write the first bit into the array includes providing the first bit to the second buffering element;

providing a second bit included in the plurality of bits to the first buffering element, wherein the second bit is provided to the first buffering element after the write process to write the first bit into the storage element is initiated; and completing the write process to write the first bit into the array after the second bit is provided to the first buffering element.

25. The method of claim 24 further including:

initiating a write process to write the second bit into the array, wherein initiating the write process to write the second bit into the array includes providing the second bit to the second buffering element;

providing a third bit included in the plurality of bits to the first buffering element substantially after the write process to write the second bit into the array is initiated; and completing the write process to write the second bit into the array after the third bit is provided to the first buffering element.

26. A method for reading a plurality of bits from a memory system, the memory system including a storage element array which includes at least one storage element, a first buffering element, and a second buffering element, the method comprising:

providing a first bit included in the plurality of bits to the first buffering element, the first bit being provided from the storage element array;

providing the first bit to a second buffering element from the first buffering element; and obtaining the first bit from the second buffering element.

27. The method of claim 26 wherein the memory system further includes a third buffering element, the method further including:

providing a second bit included in the plurality of bits to the first buffering element substantially after the first bit is provided to the second buffering element;

providing the second bit to the third buffering element from the first buffering element; and obtaining the second bit from the third buffering element substantially while the first bit is obtained from the second buffering element.

28. The method of claim 26 further including:

providing a second bit included in the plurality of bits to the first buffering element substantially after the first bit is provided to the second buffering element; and obtaining the second bit from the first buffering element substantially while the first bit is obtained from the second buffering element.

29. The method of claim 26 wherein the memory system further includes a data receiver, and the first buffering element is further arranged to receive a second bit from the storage element array and to provide the second bit to the data receiver.

30. A memory system, the memory system being suitable for storing data, the memory system comprising:

a first element;

a second element, the second element being arranged to provide a first bit and a second bit;

a first buffering element, the first buffering element being arranged to obtain the first bit from the second element, the first buffering element further being arranged to provide the first bit to the first element; and a second buffering element, the second buffering element being arranged to obtain the second bit from the second element substantially while the first bit is provided by the first buffering element to the first element, the second buffering element further being arranged to provide the second bit to the first element after the first bit is provided by the first buffering element to the first element.

31. The memory system of claim 30 wherein the first buffering element is a first latch and the second buffering element is a second latch.

32. The memory system of claim 30 wherein the memory system is a non-volatile memory system.

33. The memory system of claim 32 wherein the non-volatile memory system is a memory card.

34. The memory system of claim 30 further including:

a third element, wherein the second buffering element is still further arranged to provide the second bit to the third element.

35. A method for pipelining bits in a system, the system including a first element, a first latching element, a second latching element, and a ripple clock, the method comprising:

loading a first bit into the first latching element;

initiating a process to provide the first bit to the first element, wherein the first element is arranged to at least temporarily hold the first bit; and loading a second bit into the second latching element, wherein the ripple clock enables the second bit to be loaded into the second latching element substantially at the same time as the process to provide the first bit into the first element is initiated.

36. The method of claim 35 further including completing the process to provide the first bit to the first element after the second bit is provided to the second latching element.

37. The method of claim 36 wherein the process is a write process, the write process being arranged to write the first bit into the first element.

38. The method of claim 37 wherein the system includes a second element, the method further including:

reading the first bit from the second element, wherein reading the first bit from the second element loads the first bit into the first latching element; and reading the second bit from the second element, wherein reading the second bit from the second element loads the second bit into the second latching element, whereby the ripple clock enables the second bit to be read from the second element substantially at the same time as the process to provide the first element is initiated.

* * * * *